United States Patent [19]

Scholz

[11] 4,331,927
[45] May 25, 1982

[54] NONINVERTING AMPLIFIER CIRCUIT WITH LOW INPUT IMPEDANCE

[75] Inventor: Werner Scholz, Gehrden, Fed. Rep. of Germany

[73] Assignee: Licentia Patent-Verwaltungs-G.m.b.H., Frankfurt am Main, Fed. Rep. of Germany

[21] Appl. No.: 106,162

[22] Filed: Dec. 21, 1979

[30] Foreign Application Priority Data

Dec. 23, 1978 [DE] Fed. Rep. of Germany ....... 2856044

[51] Int. Cl.³ .......................... H03F 1/34; H03G 7/00
[52] U.S. Cl. ....................................... 330/51; 330/85; 330/100; 330/306; 333/14
[58] Field of Search ...................... 330/51, 69, 85, 100, 330/260, 302, 305, 306; 333/14

[56] References Cited

U.S. PATENT DOCUMENTS 4,190,806 2/1980 Wermuth .......................... 330/85 X
4,222,012 9/1980 Yokoyama ............................ 330/85

Primary Examiner—James B. Mullins
Attorney, Agent, or Firm—Spencer & Kaye

[57] ABSTRACT

A non-inverting amplifier circuit having input and output terminals wherein the input impedance between the input terminal and a reference point is relatively low. The circuit comprises a first amplifier having a non-inverting input coupled to the input terminal, an inverting input, and an output coupled to the output terminal. A second amplifier is also provided, the second amplifier having a non-inverting input, an inverting input coupled to the output of the first amplifier and an output coupled to the non-inverting input of the first amplifier.

6 Claims, 3 Drawing Figures

NONINVERTING AMPLIFIER CIRCUIT WITH LOW INPUT IMPEDANCE

BACKGROUND OF THE INVENTION

The present invention relates to a non-inverting amplifier circuit and, in particular, to a non-inverting amplifier circuit having a low input impedance.

With comparable external circuitry, a differential amplifier connected as an inverting amplifier and a differential amplifier connected as a non-inverting amplifier exhibit different amplification factors and different input impedances. In some applications, it is desirable to have an amplifier circuit with the characteristics of an inverting amplifier in which the input impedance Ri approaches zero, and in which the input terminal can be used as a current summing junction, but which circuit does not invert the input signal. In such case, it is customary to connect two inverting amplifiers in series.

It has been found that a non-inverting amplifier circuit obtained by connecting two inverting amplifiers in series is critical with respect to the frequency and phase behavior of the circuit, a characteristic which may be particularly detrimental if the circuit is used in a closed control loop. Such an arrangement may tend to self-oscillate, thus requiring additional stabilization measures. This tendency toward oscillation occurs because the lowpass filters formed by the circuit and transistor capacitances of two series-connected differential amplifiers produce a steep phase curve resulting in a critical phase shift in the input signal at lower frequencies than would be the case with only one differential amplifier. Moreover, the gain of the series-connected differential amplifiers is the product of the no-load gains of the individual amplifiers. Consequently, the greater phase shift and the higher no-load gain produces conditions in which there is a high probability that self-oscillation or resonance will occur in a closed control loop.

If, for example, such an amplifier is disposed in the feedback path of a further amplifier in order to compensate for the high attenuation produced by an adjusting member, the tendency to oscillate is substantially reduced in a single-stage amplifier. This occurs because the phase shift required for oscillation can occur only at substantially higher frequencies. Reduction of the initially low no-load gain associated with increasing frequencies prevents the loop amplification required for oscillation from being reached.

Even if the arrangement is not operated in a closed loop, the long signal delay and the lack of phase constancy over a given frequency range can be a disadvantage. It is therefore an object of the present invention to provide a non-inverting amplifier which has an input impedance and a frequency dependent phase shift between the output signal and the input signal which is almost equal to or less than that of a comparable inverting amplifier.

SUMMARY OF THE INVENTION

In accordance with the present invention, there is provided a non-inverting amplifier circuit having input and output terminals wherein the input impedance between the input terminal and a reference point is relatively low. The circuit comprises a first amplifier having a non-inverting input coupled to the input terminal, an inverting input, and an output coupled to the output terminal. A second amplifier is also provided, the second amplifier having a non-inverting input, an inverting input coupled to the output of the first amplifier and an output coupled to the non-inverting input of the first amplifier. The term amplifier is defined as an active transmission device and includes circuits in which the amplification factor is equal to or less than 1.

The present invention has the following advantages:

1. The input and output terminals of the circuit can be connected in the same manner as an inverting amplifier.
2. Only one amplifier lies in the signal path so that only the circuit and transistor capacitances of this amplifier are effective between the input and output terminals.
3. The circuit and transistor capacitances of the amplifier in the feedback path act counter to the phase characteristics of the amplifier disposed in the signal path.
4. Because of the excellent phase constancy, the circuit, when used as part of a closed control loop, is relatively secure against oscillation.
5. The circuit can be used as a summing junction.
6. In a multichannel compander, the circuit is suitable for combining signals which have been processed in separate channels.

DETAILED DESCRIPTION OF THE INVENTION

Figure 1A:
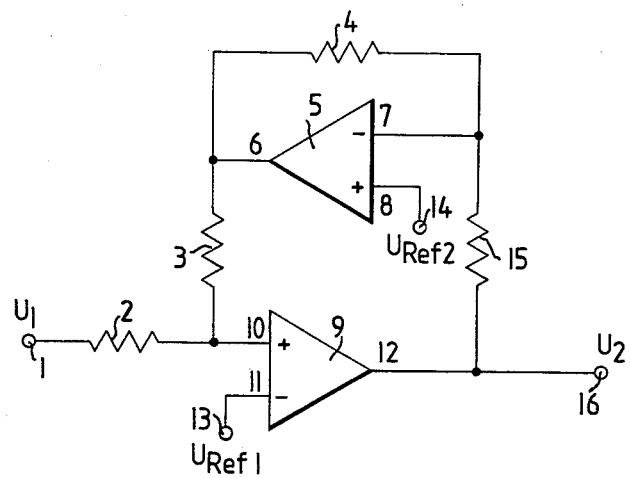
FIG. 1a shows one embodiment of the invention employing differential amplifiers.

Referring to FIG. 1a, the signal path between an input terminal 1 and an output terminal 16 includes a differential amplifier 9 connected as a non-inverting amplifier. A further differential amplifier 5, connected as an inverting amplifier, is disposed in the feedback path of the non-inverting amplifier. An input signal $U_1$ is transmitted from the input terminal 1 through a resistor 2 to the non-inverting input 10 of differential amplifier 9. The inverting input 11 of the differential amplifier is connected to a first reference voltage $U_{Ref1}$ by means of a terminal 13. The signal passing through the amplifier is obtained as an output signal $U_2$ at the output terminal 16 which is connected to the output 12 of differential amplifier 9.

The output signal is also coupled through a resistor 15 to the inverting input 7 of the differential amplifier 5 connected in the feedback path of amplifier 9. The non-inverting input 8 of the differential amplifier is connected to a second reference voltage $U_{Ref2}$ by means of a terminal 14. The amplification factor of the amplifier disposed in the feedback path of amplifier 9 can be changed by adjusting the ratio of the resistance value of a resistor 4 connected between the output 6 and the inverting input 7 and the value of resistor 15. The feedback signals appearing at the output 6 of the inverting amplifier 5 are fed, via a resistor 3, to the non-inverting input 10 of the differential amplifier 9 located in the signal path.

Since the inverting input 11 is connected to a fixed reference voltage and there is practically no voltage difference between the inverting input 11 and the non-inverting input 10 because of the high no-load gain of amplifier 9, the input 10 has an impedance of almost zero. Thus, this input has the same characteristics as the inverting input of a differential amplifier coupled in the conventional manner.

Figure 1B:
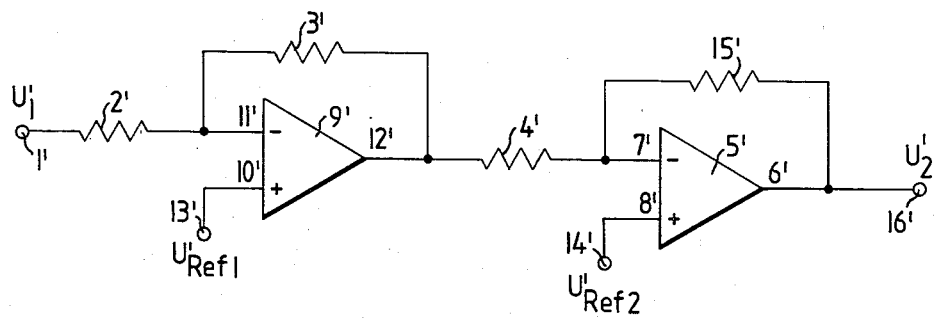
FIG. 1b shows a prior art circuit.

With high gain in the circuit, the feedback path of the amplifier 9 must have a correspondingly high attenuation. It is then advisable to connect the amplifier 5 so that its gain is less than 1. Under the condition that the differential amplifiers 9 and 5 have the same characteristics, the amplifier 5 will still operate as an almost ideal inverter even at the end of the transmission range of the circuit. The transmission range of the circuit is then determined, in the same manner as in a circuit having only one amplifier connected as an inverting amplifier with voltage feedback, by the amplifier disposed in the signal path. Thus, the circuit according to the present invention is a genuine counterpart of the prior art inverting circuit. The gain of the circuit in FIG. 1a is $$\frac{U_2}{U_1} = \frac{R_3 \cdot R_{15}}{R_2 \cdot R_4}$$

while the gain of the prior art circuit in FIG. 1b is $$\frac{U_2}{U_1} = \frac{R'_3 \cdot R'_{15}}{R'_2 \cdot R'_4}.$$

Specific frequency and phase characteristics can also be realized by the appropriate inclusion of complex impedances. For example, $$R_{15} = \frac{1}{\frac{1}{r_{15}} + j\omega c_{15}};$$

that is a resistor $r_{15}$ and a capacitor $c_{15}$ connected in parallel.

If a non-inverting summing amplifier is required in a critical control loop where it has been known to connect two inverting amplifiers in series, the circuit according to the invention provides advantages with respect to stability with the same amount of circuitry. For the sake of comparison, FIG. 1b shows the prior art circuit in which the reference numerals for the circuit elements have been given a prime sign. With the same resistance values, the two circuits have the same gain in the uncritical frequency range.

Figure 2:
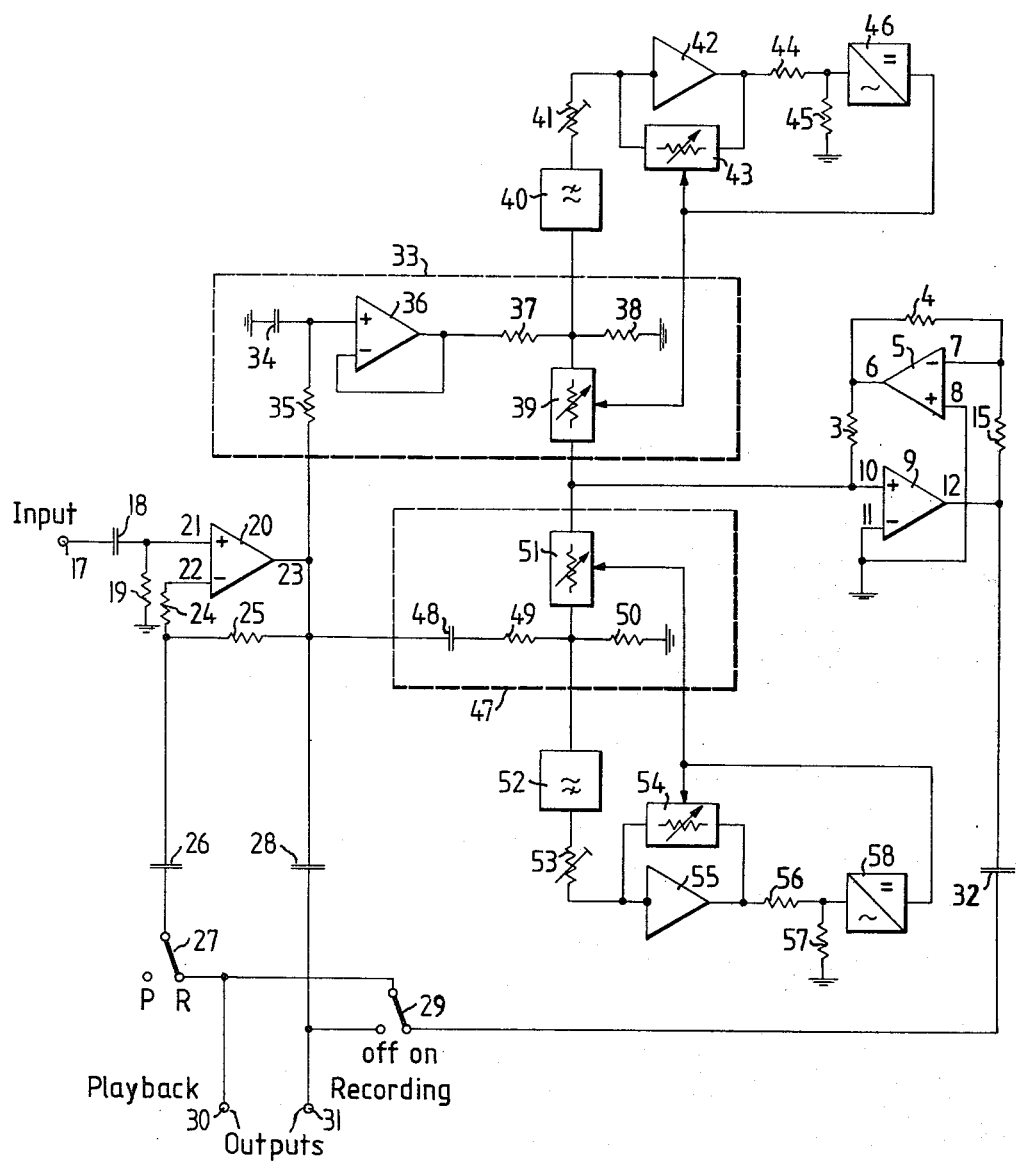
FIG. 2 is a schematic diagram of an embodiment of the invention disposed in the feedback path or in the signal path, respectively, of a dual channel compander.

An example of a circuit which requires a non-inverting amplifier in a feedback path is the circuit arrangement for automatic dynamic compression or expansion shown in FIG. 2. In this circuit, a compander receives an input signal through an input terminal 17 and applies it via a capacitor 18 to the non-inverting input 21 of a differential amplifier 20. Between the non-inverting input 21 and ground there is disposed a resistor 19 which determines the desired input resistance.

A feedback path is connected between the output 23 of the differential amplifier 20 and the inverting input 22. In the "compression" mode, the feedback path is separated for different frequency bands. For one band, the path is through a controllable filter arrangement 33 to the non-inverting input 10 of differential amplifier 9, and for the other band via a controllable filter arrangement 47 to the non-inverting input 10. Coupled to the output 12 of amplifier 9, the feedback path comprises a capacitor 32, a first switch 29, a second switch 27, a further capacitor 26 and a resistor 24 connected to the inverting input 22 of differential amplifier 20. The low-resistance output 12 of amplifier 9 causes the direct feedback path consisting of resistors 24 and 25 to be effectively bypassed, resistors 24 and 25 serving only to set the operating point of the circuit.

The signal path goes from the output 23 of the differential amplifier 20 through a capacitor 28 to an output terminal 31. During the "compression" mode, the compressed useful signals are obtained at this output terminal. During the "expansion" mode, the switch 27 is placed in the playback position "P". The feedback path of the differential amplifier 20 then extends from the output 23 through resistors 25 and 24 to the inverting input 22.

The circuit elements in the feedback path during the "compression" mode are located in the signal path during "expansion." The signal path then extends from the output 23 of the differential amplifier 20 through filter 33 and filter 47 to the non-inverting input 10 of differential amplifier 9 and from output 12 of amplifier 9 through capacitor 32 and switch 29 to the output terminal 30. When switch 29 is switched to the OFF position, the compander is ineffective and the signal at the input terminal 17 is conducted with constant unity gain through the differential amplifier 20 and capacitor 28 to the output terminals 30 and 31.

With the compander turned on by switching switch 29 to the ON position, the frequency band is divided into two ranges. The higher frequencies are processed by the controllable highpass filter 47. This filter comprises a highpass filter section including a capacitor 48 and a voltage divider consisting of resistors 49 and 50 and an electronically controllable resistor 51. The signal is fed through the controllable resistor 51 to the non-inverting input 10 of differential amplifier 9 which functions as a current summing junction. The common point of connection of resistors 49, 50 and 51 is also connected to a branch path in which the dynamic gain is reduced to zero. The branch path includes a weighting filter 52, a trimming potentiometer 53 which acts as a level setting device and an inverting amplifier 55 whose gain can be controlled by a controllable resistor 54. The output signal, having a constant amplitude in the quiescent state, is fed to a control voltage generator 58 via a voltage divider comprising the resistors 56 and 57. This control voltage generator generates a direct control voltage with which the controllable resistors 51 and 54 can be controlled in the same manner, i.e., in the sense of reducing resistance with increasing useful signal amplitude.

The low frequencies are processed by the controllable lowpass filter 33. This lowpass filter comprises a lowpass filter including resistor 35 and capacitor 34. The signal passing through the lowpass filter is fed via an impedance converter including a differential amplifier 36 to a voltage divider including resistors 37 and 38. From the tap of the voltage divider the signal is fed, via a controllable resistor 39, to the inverting input 10 of the differential amplifier 9 which serves as the current summing junction.

Corresponding to the branch path in the highpass filter, the lowpass filter also has a branch path which is connected to the tap of the voltage divider consisting of resistors 37 and 38. The signals are fed through a weighting filter 40 and a trimming potentiometer 41 to an amplifier 42. In the quiescent state, a signal of constant amplitude is obtained at the output of amplifier 42. This signal is fed, via a voltage divider comprising resistors 44 and 45, to a further control voltage generator 46 which controls the controllable resistors 39 and 43.

It is also possible to divide the frequency range of the useful signal into further frequency bands and to feed the signals through further bandpass filter and controllable resistors to the above-mentioned summing point. A prerequisite is that the differential amplifier 9 must have a low input impedance. It is likewise possible to realize pre-emphasis or de-emphasis, respectively, by including complex impedances in the circuit as previously explained in connection with FIG. 1a.

It will be understood that the above description of the present invention is susceptible to various modifications, changes and adaptations, and the same are intended to be comprehended within the meaning and range of equivalents of the appended claims.

What is claimed is:

1. A non-inverting amplifier circuit having input and output terminals, comprising:
   a first differential amplifier having a non-inverting input coupled to said input terminal, an inverting input, and an output coupled to said output terminal;
   a second differential amplifier having a non-inverting input coupled to the output of said first differential amplifier, an inverting input, and an output coupled to the inverting input of said first differential amplifier, the impedance to direct current between the output and the inverting input of said second differential amplifier being essentially infinite; and
   a third differential amplifier having a non-inverting input, an inverting input coupled to the output of said second differential amplifier and an output coupled to the non-inverting input of said second differential amplifier, the input impedance between said input terminal and a reference point being relatively low.

2. A circuit as defined in claim 1 which further comprises switching means interposed between the output of said second differential amplifier and the inverting input of said first differential amplifier, said switching means having a first position in which the output of said second differential amplifier is coupled to the inverting input of said first differential amplifier to provide compression of a signal applied to said input terminal and a second position in which the output of said second differential amplifier is disconnected from the inverting input of said first differential amplifier to provide expansion of a signal applied to said input terminal.

3. A circuit as defined in claim 1 or 2 which further comprises a controllable frequency selective filter interposed between the output of said first differential amplifier and the non-inverting input of said second differential amplifier.

4. A circuit as defined in claim 3 wherein said controllable frequency selective filter includes a high frequency section and a low frequency section.

5. A circuit as defined in claim 4 wherein the gain of each of said frequency selective filter sections is independently controllable.

6. A circuit as defined in claim 1 wherein the inverting input of said second differential amplifier and the non-inverting input of said third differential amplifier are connected to said reference point.

* * * * *